United States Patent [19]

Koppensteiner

[11] Patent Number: 4,528,616
[45] Date of Patent: Jul. 9, 1985

[54] PRINTED WIRING BOARD ENCLOSURE

[75] Inventor: James V. Koppensteiner, Chicago, Ill.

[73] Assignee: GTE Automatic Electric Inc., Northlake, Ill.

[21] Appl. No.: 479,309

[22] Filed: Mar. 28, 1983

[51] Int. Cl.³ .............................................. H05K 1/14
[52] U.S. Cl. ................................ 361/399; 174/52 R; 206/328; 361/415
[58] Field of Search ...................... 361/415, 399, 412; 174/52 R; 206/328; 335/202

[56] References Cited

U.S. PATENT DOCUMENTS

| | | | |
|---|---|---|---|
| 3,541,230 | 11/1970 | Kramer | 174/52 R X |
| 3,950,603 | 4/1976 | Brefka | 174/52 R |
| 4,089,042 | 5/1978 | Torburn | 361/399 X |
| 4,149,027 | 4/1979 | Asher et al. | 361/399 X |
| 4,303,296 | 12/1981 | Spaulding | 361/415 X |
| 4,322,702 | 3/1982 | Bosch | 206/328 X |

FOREIGN PATENT DOCUMENTS 1435654  3/1966  France ................................ 361/399

Primary Examiner—R. R. Kucia
Attorney, Agent, or Firm—Robert J. Black; Gregory G. Hendricks

[57] ABSTRACT

An enclosure for a printed wiring board. The enclosure includes a U-shaped channel member having a ledge in each of its sides. Each ledge has a floor and a wall, and each wall includes at least one projection. A printed wiring board is retained against the ledge floors by means of the projections acting against the printed wiring board. Longitudinal motion of the printed wiring board, in its retained position, is prevented by a tubular projection attached to the U-shaped member extending through an aperture in the printed wiring board. A cover is provided and retained in engagement with the U-shaped member by a plurality of cover projections engaging depressions in a cover receiving ledge formed in the U-shaped member. The enclosure is adapted to be positioned relative to a relay structure by a longitudinal rib attached to the base of the U-shaped member. A fastener extends through the cover and the tubular projection, and engages the relay structure to affix the enclosure to the relay structure.

3 Claims, 3 Drawing Figures

PRINTED WIRING BOARD ENCLOSURE

BACKGROUND OF THE INVENTION

The present invention relates to printed wiring board enclosures, and more particularly to printed wiring board enclosures adapted for mounting on a relay structure.

Printed wiring board enclosures adapted for relay structure mounting are well known to those skilled in the art. One type, the CMC A-Matic 100A, is manufactured by Communication Manufacturing Company, Long Beach, Calif., and employs a printed wiring board receiving container and a cover. The printed wiring board receiving container consists of a base, two side walls and one end joining the side walls and base. The cover is arranged to mate with the side walls and end to form the printed wiring board enclosure with the other end being left open. Apertures are formed in the cover and base to receive a screw, by which the enclosure is mounted to the heel piece of a telephone type relay.

A ledge is formed in the side walls and end to receive the printed wiring board. The cover includes a lip formed around its periphery and sized to abut the side walls and end when the cover is assembled to the printed wiring board container. The lip is of sufficient width to extend over the printed wiring board in its assembled position to retain the printed wiring board within its receiving ledge. A tubular insulating projection is attached to the base and extends through an aperture in the printed wiring board to permit passage of a fastener through the printed wiring board while protecting the printed wiring board from the fastener. A tubular projection is attached to the cover and extends downward to abut the base projection. The two projections cooperate when the enclosure is fastened to a relay structure to prevent the transmission of compressive stresses to the printed wiring board from the fastener.

Such an arrangement, while operating generally satisfactorily, requires costly ultrasonic bonding equipment to affix the cover to the container.

Another type of printed wiring board enclosure, the TSI-1-AR, is manufactured by Telco Systems Incorporated, Wayco, Tex., and includes two similar enclosure halves. Each enclosure half includes a side panel, a bisected base segment, a bisected roof segment and two bisected end segments, one of which includes a rectangular section cut therefrom. Each side panel includes a plurality of projection pairs. Each projection of a pair is positioned opposite to the other on either side of a printed wiring board mounting plane. One enclosure half includes a fastener engaging slot extending perpendicularly from the uncut end section in the plane of the base section. The other enclosure half includes an L-shaped positioner affixed to the base portion and oriented to form a channel in cooperation with the base portion. The channel is positioned to engage the relay heel piece edge when the enclosure is mounted to a relay structure.

The printed wiring board is assembled within the enclosure by positioning an edge of the printed wiring board between the projection pairs of each enclosure section and then bringing the enclosure sections together about the printed wiring board.

Yet another printed wiring board enclosure arranged for relay mounting, the #831-3000, is produced by Sace Incorporated, San Angelo, Tex. However, the printed wiring board mounting arrangements of this enclosure are unknown.

SUMMARY OF THE INVENTION

In accordance with the present invention, an enclosure for a printed wiring board is provided. This enclosure includes a U-shaped member including at least a base and first and second opposite sides. Each of the sides includes at least an inner wall facing the inner wall of the opposite side. This enclosure also includes a cover adapted to engage the U-shaped member, and at least first and second printed wiring board receiving ledges formed in each of the inner walls. Each of the ledges includes a wall parallel to the respective side and a floor perpendicular to the wall. The floors lie in a common plane and the ledges are adapted to receive a printed wiring board. The enclosure further includes at least one projection formed in each of the ledge walls. The projections deflect to permit the printed wiring board to pass and the projections restore following passage of the printed wiring board to retain the printed wiring board.

DESCRIPTION OF THE PREFERRED EMBODIMENT

Figure 1:
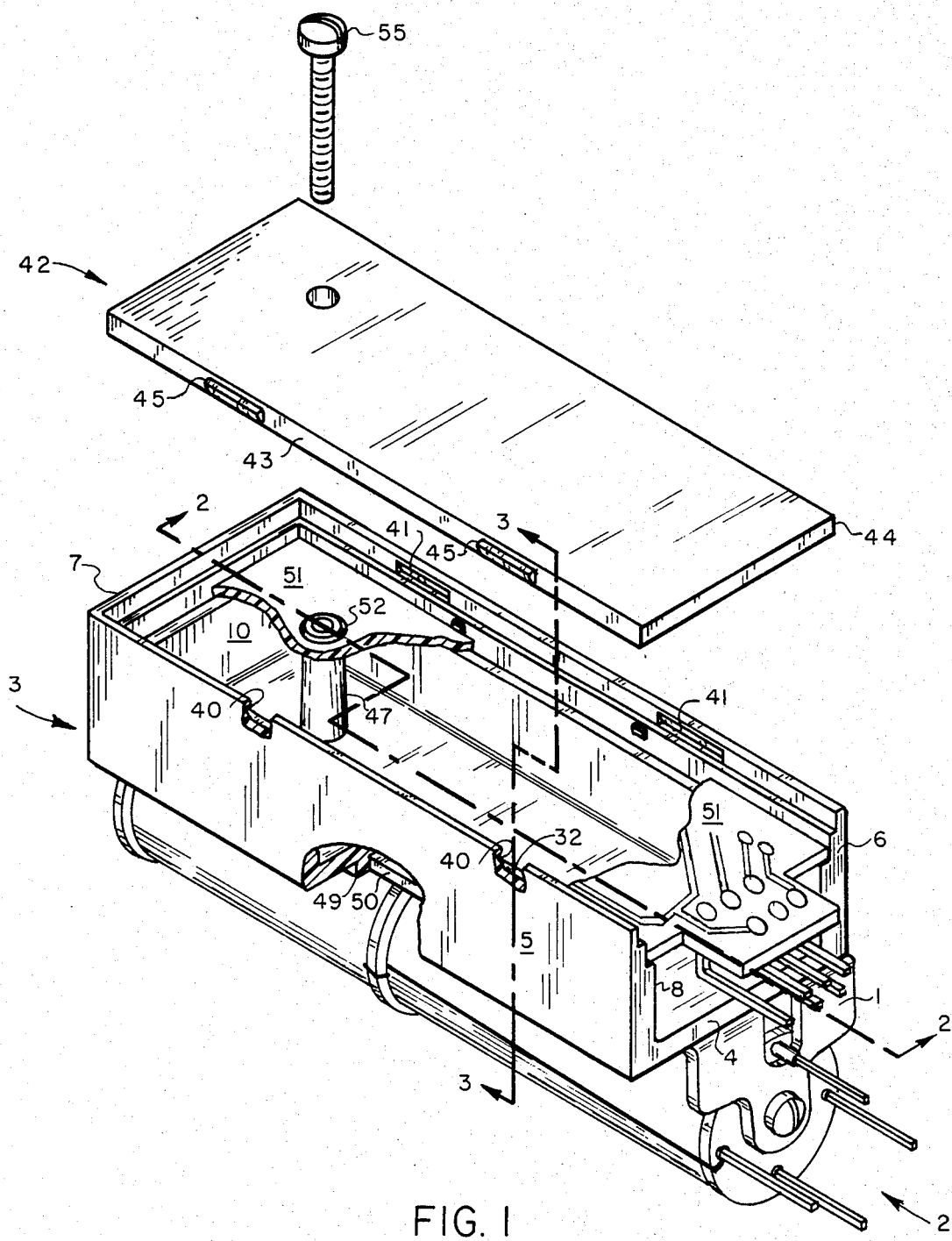
FIG. 1 is an exploded perspective view of the printed wiring board enclosure of the subject invention mounted to a relay structure.
Figure 2:
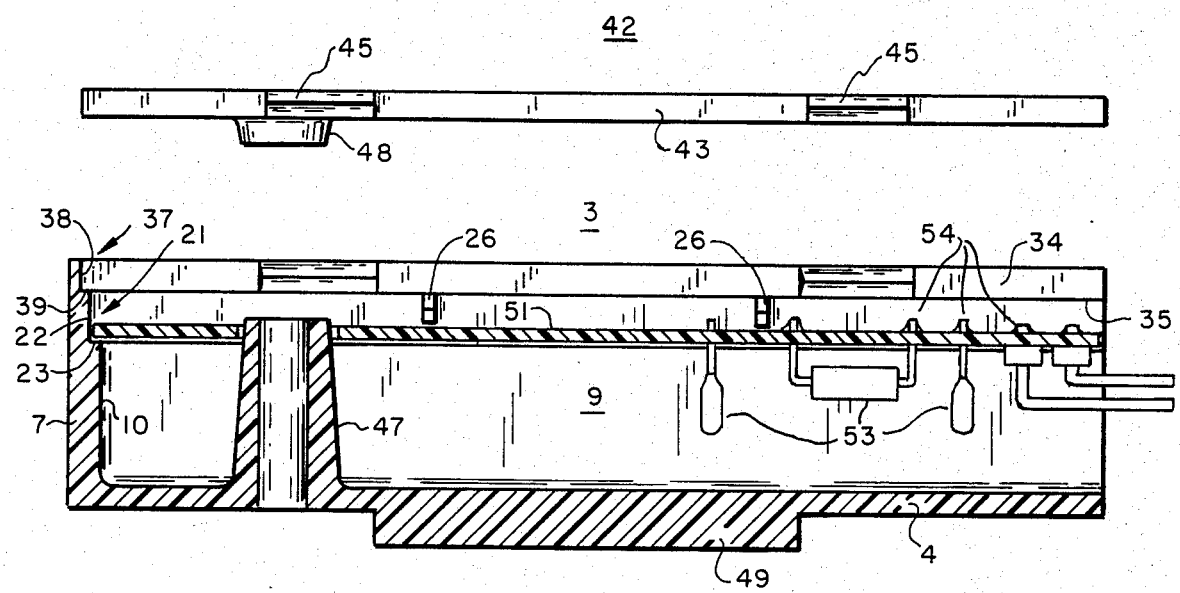
FIG. 2 is a sectional view taken substantially along line 2—2 of FIG. 1.
Figure 3:
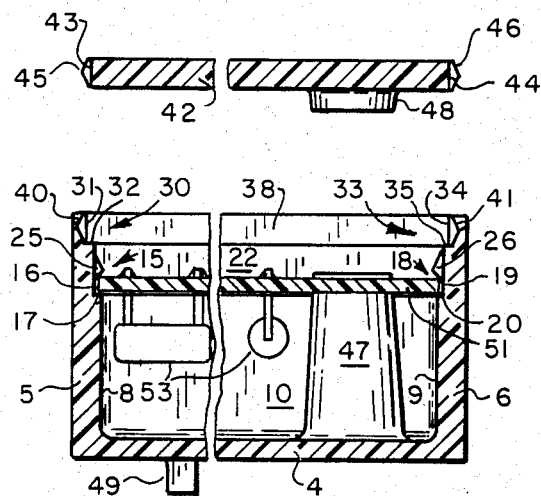
FIG. 3 is a sectional view taken substantially along line 3—3 of FIG. 1.

Referring now to FIG. 1, a printed wiring board enclosure of the present invention is shown which is adapted for mounting to a heel piece 1 of a relay (support structure) 2. The printed wiring board enclosure includes a U-shaped member 3 which includes a base 4, a first side 5, a second opposite side 6, and an end 7 having an interior wall 10. The first side 5 and the second side 6 each include an interior wall 8 and 9, respectively. Referring now to FIG. 3, a printed wiring board receiving ledge 15 is formed in the inner wall 8 of the first side 5 and includes a ledge wall 16 parallel to the first side 5 and a ledge floor 17 perpendicular to the first wall 5. Similarly, the inner wall 9 of the second wall 6 includes a printed wiring board receiving ledge 18 including a ledge wall 19 parallel to the second wall 6 and a ledge floor 20 perpendicular to the second wall 6. Referring now to FIG. 2, a printed wiring board receiving ledge 21 is formed in the inner wall 10 of the end 7 and includes a ledge wall 22 parallel to the end 7 and a ledge floor 23 perpendicular to the end 7. Referring again to FIG. 3, the printed wiring board receiving ledge 15 includes at least one projection 25 formed in the ledge wall 16 and the printed wiring board receiving ledge 18 includes at least one projection 26 formed in the ledge wall 19.

The first wall 5 further includes a cover receiving ledge 30 including a ledge wall 31 parallel to the first side 5 and a ledge floor 32 perpendicular to the first side 5. The second wall 6 similarly includes a cover receiving ledge 33 including a ledge wall 34 parallel to the second wall 6 and a ledge floor 35 perpendicular to the second wall 6.

Referring again to FIG. 2, the end 7 includes a cover receiving ledge 37 including a ledge wall 38 parallel to the end 7 and a ledge floor 39 perpendicular to the end 7.

Referring again to FIG. 3, at least one cover retaining depression 40 is formed in the ledge wall 31 of the cover receiving ledge 30, and at least one cover retaining depression 41 is formed in the ledge wall 34 of the cover receiving ledge 33.

A cover 42 is provided including a left side edge 43 and a right side edge 44. At least one cover retaining projection 45 is formed in the left side edge 43 and at least one cover retaining projection 46 is formed in the right side edge 44.

The printed wiring board receiving ledge floors 17, 20 and 23 are formed in a common plane and the cover receiving ledge floors 32, 35 and 39 similarly reside in a common but different plane.

A tubular base (first) projection 47 extends upward from the base 4 a distance greater than the height of the printed wiring board receiving ledges 17, 20 and 23 (shown in FIG. 2). A tubular cover (second) projection 48 extends below the cover 42 in alignment with the base projection 47. An elongated rib 49 is attached to base 4 and extends perpendicularly therefrom.

In operation, a printed wiring board 51 is positioned with its edges above the printed wiring board receiving ledges 15 and 18, and a hole 52 (shown in FIG. 1) in the printed wiring board is positioned above the projection 47. Force is then applied to the printed wiring board 51 urging it in a direction toward the base 4. As the printed wiring board 51 moves towards the base 4, its edges engage the board retaining projections 25 and 26 deflecting them outward. As the printed wiring board 51 passes the board retaining projections 25 and 26, they restore to their original positions. In its final position, the printed wiring board 51 rests against the ledge floors 17, 20, and 23 of the board retaining ledges 15, 18 and 21, respectively, and is retained in that position by the board retaining projections 25 and 26.

The board retaining projection 25, the board retaining ledge floor 27, and the area between them form a first board receiving area. Similarly, the board retaining projection 26, the board retaining ledge floor 20, and the area between them form a second board receiving area. The printed wiring board 51 is retained within the first and second board receiving areas.

The cover 42 is then positioned above the U-shaped member 3 (shown in FIG. 1) with the cover side edges 43 and 44 above the cover receiving ledges 30 and 33. The tubular cover projection 48 is positioned above the tubular base projection 47. Force is then applied to the cover 42 in a direction towards the base 4 causing the cover retaining projections 45 and 46 to engage the cover retaining depressions 40 and 41, respectively. In its final position, the cover 42 rests against the cover receiving ledge floors 32, 35 and 39.

The ledges 15 and 18 are formed in the walls 8 and 9, respectiveley, at such a distance from base 4 as to permit a plurality of components 53 to be mounted on the printed wiring board 51 and extend in the direction of the base 4. The ledges 30 and 33 are formed in walls 8 and 9, respectively, at such a distance from base 4 as to permit clearance between the cover 42 and projections 54 extending from the printed wiring board 52 in the direction of the cover 42.

Referring now to FIG. 1, the assembled enclosure may be attached to a relay structure. In this regard, the base 4 may be positioned adjacent to the surface of the relay heel piece 1 with the rib 49 adjacent to a heel piece edge 50. A screw 55 (fastener) may then be inserted through the tubular cover projection 48 (shown in FIG. 2) and the tubular base projection 47 to engage the relay heel piece 1. As the fastener 51 is tightened to secure the enclosure to the relay heel piece 1, the tubular cover projection 48 abuts the tubular base projection 47 to secure the enclosure to he heel piece 1 while preventing fastening stresses from being transmitted to the printed wiring board 51.

The present invention thus provides a novel arrangement for retaining a printed wiring board in an enclosure and mounting such enclosure to a relay structure.

The present invention has been described with reference to a specific embodiment thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. An enclosure adapted to contain an associated printed wiring board; said enclosure adapted for attachment to an associated relay; said enclosure comprising:
   a U-shaped member including at least a base and first and second opposite sides, each of said sides including at least an inner wall facing the inner wall of the opposite side;
   a cover adapted to engage said U-shaped member;
   a board receiving ledge formed in each of said inner walls, each of said board receiving ledges including a board receiving ledge wall parallel to said respective side and a board receiving ledge floor perpendicular to said respective side, said floors lying in a common plane, and said ledges adapted to receive said printed wiring board;
   at least one projection formed in each of said board receiving ledge walls, said projections deflected to permit said printed wiring board to pass and said projections restored following passage of said printed wiring board to retain said printed wiring board;
   an aperture formed in said printed wiring board;
   a first projection attached to said base; extending therefrom in a direction toward said cover and through said printed wiring board aperture;
   a second projection attached to said cover, extending therefrom in a direction toward said base and abutting said first projection; a fastener extending through said cover, said printed wiring board aperture, and said U-shaped member and engaging said relay to attach said enclosure to said relay while preventing the application of tightening stresses to said printed wiring board.

2. An enclosure as claimed in claim 1, wherein: said first projection positions said fastener to prevent contact between said fastener and said printed wiring card.

3. An enclosure as claimed in claim 1, wherein: said first projection projects through said aperture in said printed wiring board to prevent longitudinal motion of said printed wiring board within said U-shaped member.

* * * * *